(12) United States Patent
Deboy et al.

(10) Patent No.: US 6,936,866 B2
(45) Date of Patent: Aug. 30, 2005

(54) SEMICONDUCTOR COMPONENT

(75) Inventors: Gerald Deboy, München (DE); Gerald Mündel, Ebersberg (DE)

(73) Assignee: Infineon Technologies AG, Munich (DE)

( * ) Notice: Subject to any disclaimer, the term of this patent is extended or adjusted under 35 U.S.C. 154(b) by 269 days.

(21) Appl. No.: 10/033,227

(22) Filed: Oct. 22, 2001

(65) Prior Publication Data

US 2002/0060340 A1 May 23, 2002

Related U.S. Application Data

(63) Continuation of application No. PCT/DE00/01251, filed on Apr. 20, 2000.

(30) Foreign Application Priority Data

Apr. 21, 1999 (DE) .......................................... 199 18 028

(51) Int. Cl.[7] ........................ H01L 29/423; H01L 29/43; H01L 29/76
(52) U.S. Cl. ........................ 257/135; 257/134; 257/141; 257/368
(58) Field of Search ................................ 257/134, 135, 257/368, 141

(56) References Cited

U.S. PATENT DOCUMENTS

| 4,811,075 A | 3/1989 | Eklund |
| 5,170,241 A | 12/1992 | Yoshimura et al. |
| 5,285,369 A | 2/1994 | Balakrishnan |
| 5,296,725 A | * 3/1994 | Nandakumar et al. ...... 257/138 |
| 5,313,082 A | 5/1994 | Eklund |
| 5,780,895 A | * 7/1998 | Barret et al. ................. 257/328 |
| 6,359,309 B1 | * 3/2002 | Liao et al. ................... 257/341 |

FOREIGN PATENT DOCUMENTS

| DE | 44 29 284 A1 | 2/1996 |
| EP | 0 585 788 A1 | 3/1994 |
| JP | 03 155 167 A | 7/1991 |
| JP | 11-41019 | 2/1999 |
| JP | 11-251834 | 9/1999 |

OTHER PUBLICATIONS

G. Deboy et al.: "A new generation of high voltage MOSFETs breaks the limit line of silicon", *IEDM 98*, pp. 683–685, XP–000859463.

* cited by examiner

*Primary Examiner*—Amir Zarabian
*Assistant Examiner*—Kiesha Rose
(74) *Attorney, Agent, or Firm*—Laurence A. Greenberg; Werner H. Stemer; Ralph E. Locher

(57) ABSTRACT

A vertical or lateral semiconductor component derives a signal from a high load voltage. This signal can be used directly for driving the semiconductor component or, alternatively, a control device.

18 Claims, 5 Drawing Sheets

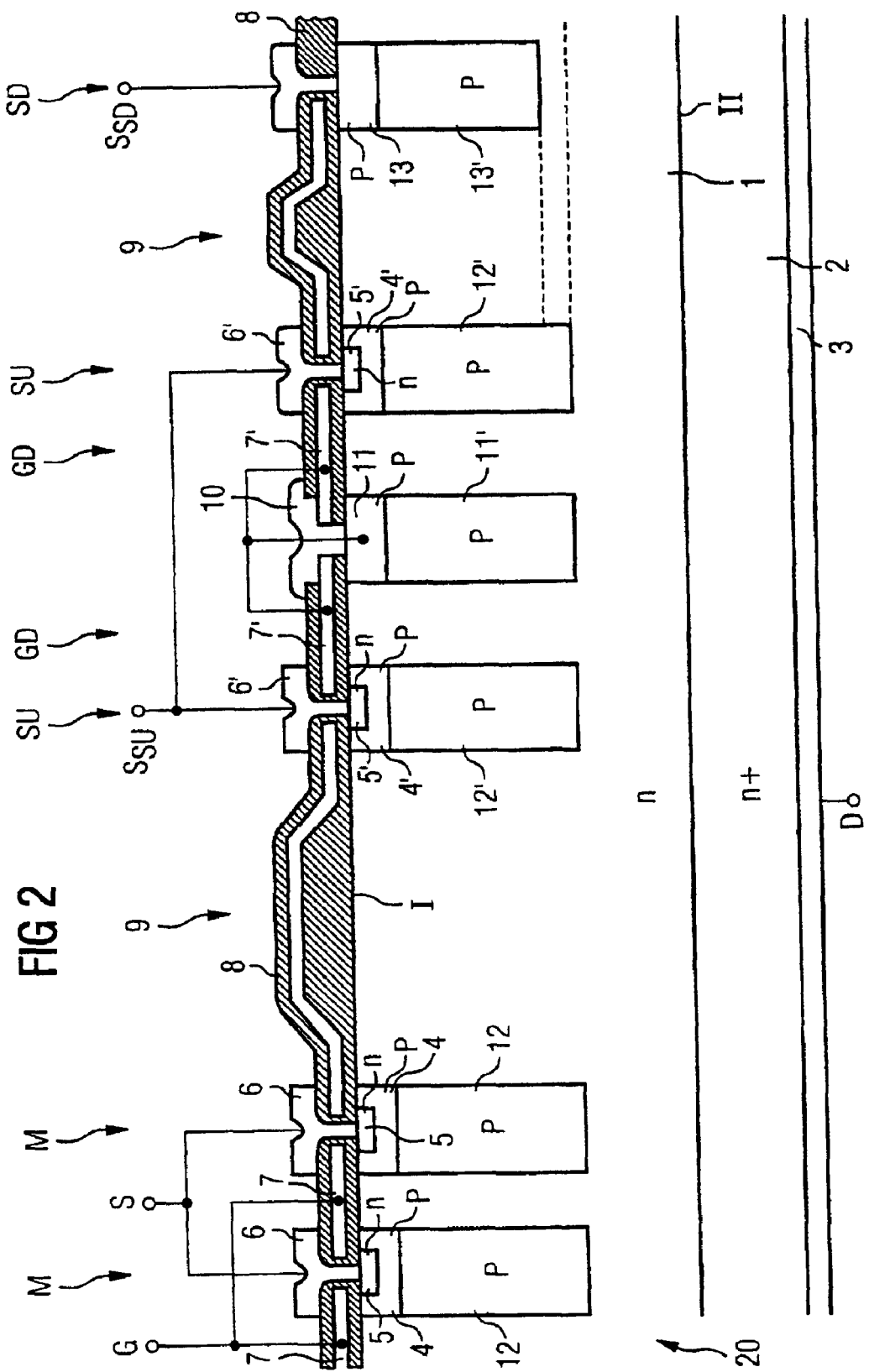

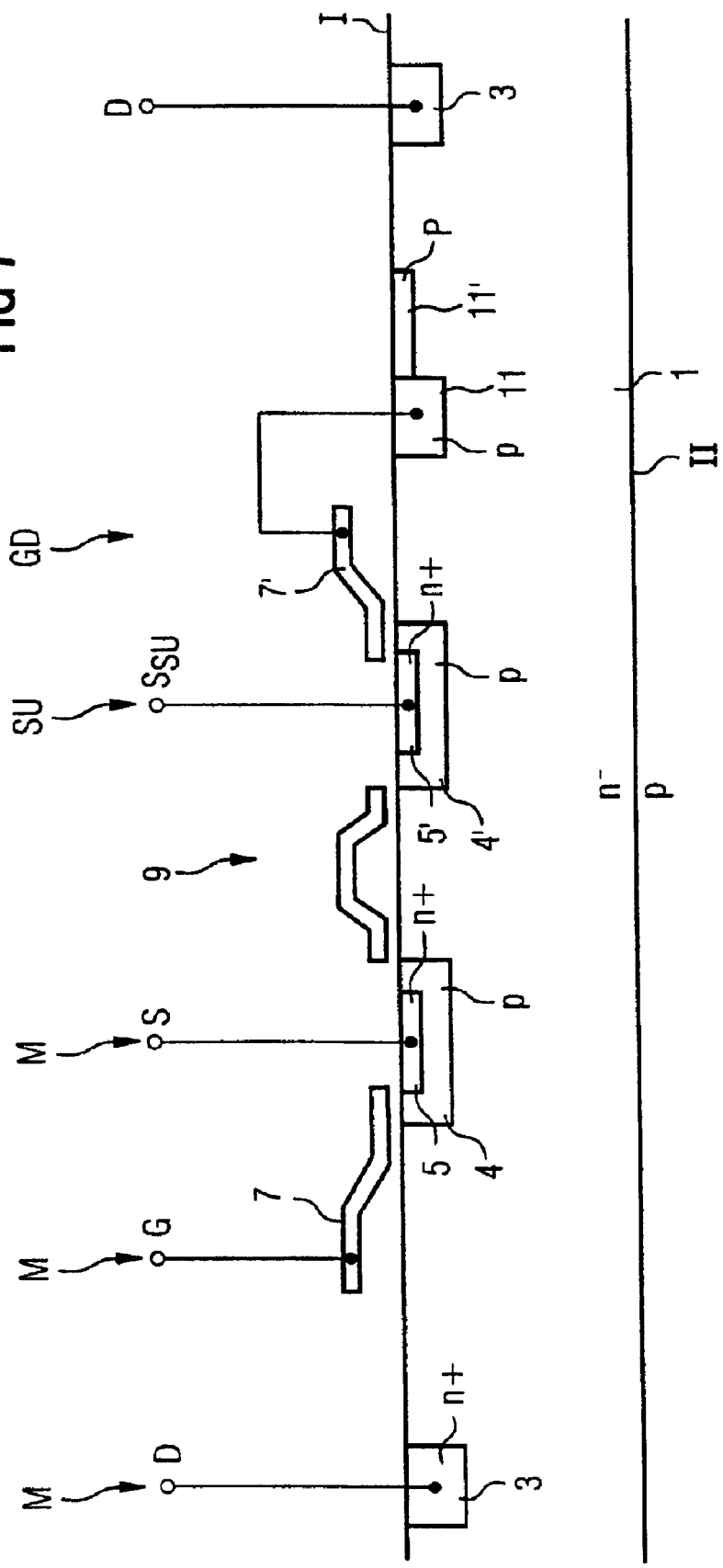

SEMICONDUCTOR COMPONENT

CROSS-REFERENCE TO RELATED APPLICATION

This application is a continuation of copending International Application No. PCT/DE00/01251, filed Apr. 20, 2000, which designated the United States.

BACKGROUND OF THE INVENTION

Field of the Invention

The invention relates to a voltage-controlled semiconductor component in which a high voltage is present between the terminals forming the load path.

The costs in the manufacture of a grid power supply constitute a fundamental problem. Suitable selection of a grid power supply is dependent on the application, just like the components that are intended to be used. Switched-mode grid power supplies, in particular, are being used more and more often. This is due, inter alia, to the fact that many complex circuit configuration of a switched-mode power supply can be combined on a single integrated semiconductor chip. This enables cost-effective manufacture. A semiconductor chip of this type has, in particular, a power switching device and a drive configuration for the power switching device. In this case, the load terminals of the power switching device are connected to a high supply voltage, whereas a voltage having a significantly lower signal level is required for driving the power switching device. Therefore, the integrated semiconductor chip has regions that are configured for a high-voltage application (power switching device) and further regions that work with a low voltage level (drive configuration). Therefore, a semiconductor chip of this type requires a terminal to which a high supply potential can be applied, and also a further terminal that makes available a low supply potential for the control components. The low supply potential can be generated for example by reducing the high supply potential via a resistor between the further terminal and the high supply potential. However, wiring of this type causes permanent losses.

Therefore, it would be advantageous if a signal that is fed to a drive configuration and would serve for its supply could be derived directly from the load voltage present across the power-switching device. At the same time, the power-switching device should assume the lowest possible forward resistance in the conducting state.

A power-switching device of this type is disclosed, for example, in Balakrishnan (U.S. Pat. No. 5,285,369), which describes an integrated circuit configuration used in a switched-mode power supply. In this case, the integrated circuit configuration has a power-switching device including two semiconductor switches connected in series with one another. The first semiconductor switch is a JFET, while the second semiconductor switch is a high-voltage MOSFET. At the junction point between the two semiconductor switches, which are connected up in series by their load paths, a low voltage can be tapped off, which is fed to a voltage regulator of the drive device. As a result, components having a high and having a low supply potential requirement in the integrated circuit configuration can be combined because a signal derived from the load voltage can be fed to the components having a low supply potential. The construction of the power-switching device including a JFET and a high-voltage MOSFET is described for example in Eklund (U.S. Pat. No. 4,811,075) or Eklund (U.S. Pat. No. 5,313,082).

However, disadvantages with such power switching devices (hereinafter, "semiconductor component") include the complex fabrication method requiring very many mask steps to fabricate the complicated layer sequence and the different doping thereof.

SUMMARY OF THE INVENTION

It is accordingly an object of the invention to provide a semiconductor component that overcomes the hereinafore-mentioned disadvantages of the heretofore-known devices of this general type and that derives a signal from a high load voltage; this signal can be used directly for driving the semiconductor component or, alternatively, a control device. A further object is to fabricate the semiconductor component in a simple manner.

With the foregoing and other objects in view, there is provided, in accordance with the invention, a semiconductor component. The semiconductor component can be vertical or lateral. The semiconductor component includes a substrate, a more highly doped layer, a multiplicity of MOS cells, a first well, a first source region, a first gate, a plurality of further MOS cells, and at least one region of the second conductivity type. The substrate of a first conductivity type has a first and a second side covered by an insulating layer on the first side. The more highly doped layer of the first conductivity type is applied on the second side. The metallic drain contact is applied on the more highly doped layer. The multiplicity of MOS cells on the first side of the substrate is for forming a first semiconductor switch. Each MOS cell has a first well of the second conductivity type, the first well being introduced into the substrate and reaching the first side; a first source region of the first conductivity type is incorporated into the well, reaches to the first side of the substrate, and connects to a first metallic source contact extending through the insulating layer. A first gate is on the side of the insulating layer that is remote from the substrate. The gate partly covers the well and connects to a metallic gate contact. A plurality of further MOS cells constructed like the multiplicity of MOS cells has a second well, a second source region, and a second gate on the first side of the substrate for forming a second semiconductor switch; the second source regions of the further MOS cells connect to a second source contact on the first side. The source contact is electrically insulated from the first source contact and extends through the insulating layer. A region of the second conductivity type is incorporated into the substrate, reaches to the first side, and electrically connects to the second gate of the further MOS cells. The potential of the region floats relative to the potential of the first and second source regions of the MOS cells and further MOS cells.

The basic construction and the method of operation are explained below. The semiconductor component is configured, in particular, as a MOSFET or IGBT. In practice, a semiconductor component of this type includes a multiplicity of MOS cells that are connected in parallel and are introduced on a first side of a substrate of the first conductivity type. The load voltage is present between a source contact and a drain contact. The voltage present at a gate sets the magnitude of the current between the source contact and the drain contact. The MOS cells connected in parallel form the "active cell array" of the semiconductor component and have a first source contact. This cell array forms a first semiconductor switch.

A region of some MOS cells is provided with a dedicated, second source contact to derive a signal having a significantly lower voltage from the load voltage between the source contact and drain contact, according to the invention, in the active cell array of the semiconductor component. This means nothing more than that the first metallic source contact, which is connected to the source regions of the MOS cells forming the active cell array, is interrupted. Furthermore, in the case of the further MOS cells (disconnected MOS cells), the gate contacts are electrically isolated from the first gate contacts of the MOS cells facing the cell array. These cells then form a second semiconductor switch that shares its drain with the drain of the first semiconductor switch. The cells of the second semiconductor switch are hereinafter called "start-up cells". The gate of the start-up cells is readable and can be conductively connected to a likewise separately metallized "source region" of further adjacent cells. These source regions of the second conductivity type form, with the substrate and at least one well of the start-up cells, which are likewise of the second conductivity type, at least one parasitic transistor, which are hereinafter called "gate-drive cell". These cells have a drain terminal shared with the first and second semiconductor switches.

The potential of the "source regions" floats relative to the source potential of the start-up cells and relative to the source potential of the MOS cells of the semiconductor component that belong to the active cell array. If the source potential of the start-up cells is capacitively coupled to the source potential of the MOS cells of the active cell array of the semiconductor component, then it is the case that, due to this capacitive coupling, in the event of a rising drain-source voltage across the active cell array, the voltage between the source region of the start-up cells and the drain region of the semiconductor component also rises. All the cells of the semiconductor component share the drain region of the active cell array. As a result of the capacitive coupling, a space charge zone that extends both vertically and laterally forms around the well surrounding the source region of the start-up cells. As soon as the space charge zone reaches the adjacent "source region", these are coupled in terms of potential. The voltage at which the space charge zone reaches the adjacent source regions of the gate-drive cells is hereinafter called "punch-through voltage". In this case, the punch-through voltage can be set by the doping of the substrate at the surface and by the distance between the source region and the start-up cells. It is ideally set to a value distinctly above the threshold voltage of the start-up cell, but below the maximum specification limit thereof: a value of twelve volts (12 V) being customary in high-voltage power technology. This voltage cannot be exceeded even in the event of very high drain-source voltage differences of the MOS cells of the active cell array. This is of great importance particularly in the event of very rapid du/dt peaks in the load circuit because the gate voltage of the start-up cells is intended to be switched by the potential of the source regions. This natural limiting of the voltage occurring at the source regions achieves perfect protection of the gate oxide of the start-up cells. The voltage to be applied by the start-up cells typically lies between ten and fifteen volts (10–15 V). This voltage is sufficient for operating a control device (for example a control IC) and for directly driving the first gate of the MOS cells of the active cell array.

Furthermore, the semiconductor component according to the invention has the advantage that even negative supply potentials between the source and drain contacts of the active cell array do not lead to destruction of the start-up cells or gate-drive cells (i.e. of the source region). In this case, the "body diode" formed between the well with respect to the substrate of the start-up cells or source regions functions as a protective element. Therefore, no voltage difference of more than −1 V with respect to the drain region can occur at the gate of the start-up cells. By contrast, the potential difference of the second gate of the start-up cells relative to the source potential of the start-up cells can assume large values if the voltage of the start-up cells is buffered by an external charge store and is not limited. Therefore, external voltage limiting with a zener diode, for example, is advantageous when using the semiconductor component according to the invention. In practice, however, there is no restriction on use because, in the standard power technologies used, the gate oxide can be continuously loaded up to twenty volts (<20 V) and momentarily loaded up to fifty volts (<50 V).

In one preferred configuration of the MOS cells, the gate-drive cells, or source regions of the second conductivity type, are surrounded exclusively by the start-up cells. Together, they form a structure that switches on the MOS cells of the active cell array.

As an alternative, at least one start-up cell can be surrounded exclusively by gate-drive cells (or source regions of the second conductivity type). The resulting structure switches on the MOS cells of the active cell array.

This structure that switches on the active cell array can advantageously be configured adjacent the MOS cells of the active cell array or be completely surrounded by the MOS cells of the active cell array. This configuration produces a signal having, in comparison, a significantly lower voltage generated from the voltage present between the drain and source contacts of the active cell array. This signal can be used for driving either the first gate of the semiconductor component or, alternatively, a control IC.

A lateral insulation is advantageously provided between the MOS cells of the active cell array and the structure that switches on these cells, in order to avoid parasitic effects.

In a further advantageous refinement, the source region of the gate-drive cell is disposed near the drain electrode holding the charge. Then, by virtue of the propagation of a space charge zone between the MOS cells of the start-up cell and the source region of the gate-drive cell, the gate can drive the start-up cell in all cases. The source region of the gate-drive cells is adapted to the punch-through voltage in the event of a threshold voltage being exceeded in the load circuit of the semiconductor component, which threshold voltage can be predetermined by the configuration of the source region.

A minimal power is required for driving the second gate of the start-up cell, since MOS gates require a minimal gate charge on account of their capacitive coupling to the substrate. This minimal charge has to be accumulated during the propagation of the space charge zone from the source region of the gate-drive cell. At the same time, the potential of the source regions of the gate-drive cell must be higher than the source potential of the start-up cell at least by the magnitude of the threshold voltage of the start-up cell. Therefore, a charge carrier reservoir connected to the source region of the gate-drive cell must be present.

This merely means that the source region of the gate-drive cell must be configured in such a way as to enable effective accumulation of the charge by the gate-drive cell through the formation of an electric field. Therefore, the source region of the gate-drive cell is configured in such a way that the latter is completely depleted in the event of propagation of the space charge zone between the source region of the start-up cell and the drain region. The local electric field generated by this region relative to the substrate must be high enough that the depletion charge flows into the source region of the gate-drive cell, and charges the latter further, even in the event of a positive potential of the source region of the gate-drive cell relative to the potential of the start-up cells or the potential of the wells of the second conductivity type of the MOS cells of the active cell array. The configuration of such a region, a buried region, is known from "compensation components". These regions can advantageously be fabricated in a simple manner without a further additional mask relative to a standard process in the case of compensation components. The fabrication method is described for example in German Patent DE 198 40 032, corresponding to International Publication WO 00/14807, which was not published before the priority date. In the case of a semiconductor component of vertical construction, therefore, the source region is advantageously extended orthogonally with respect to the main sides of the first substrate in the direction of the drain region.

In an advantageous refinement, the wells of the second conductivity type of the MOS cells and of the start-up cells may likewise be formed orthogonally with respect to a main side of the semiconductor component in the direction of the drain electrode. The advantages are that a high avalanche strength and a large current-carrying capacity before or during breakdown are made possible as a result in the active cell array of the semiconductor component.

In the case of a semiconductor component of lateral construction, the source region of the gate-drive cells is advantageously formed parallel to the main sides of the substrate in the direction of the drain region. In this case, the source region of the gate-drive cells may run along the top side in the substrate of the semiconductor component.

The source region of the gate-drive cell is dimensioned in such a way that the charge of this region suffices to charge, at least to the threshold voltage of the start-up cells, the gate to be switched of all the start-up cells whose gates are connected to the source region of the gate-drive cells. In this case, dimensioning can be understood to mean both the spatial configuration and the doping of the source region. Since parasitic capacitances and leakage currents occur in practice, dimensioning with which, for example, the gate of two start-up cells can be charged by a gate-drive cell is advantageous. Depending on the configuration of the source region of the gate-drive cell, it may be necessary to use a plurality of gate-drive cells for driving a start-up cell.

In order to prevent unintentional latching in the source region, the source region preferably is without a region of the first conductivity type. Consequently, a switch-on of a parasitic bipolar structure in the source region is prevented even in the event of a high hole current. The customary implantation during the fabrication of a conventional MOS cell should therefore be shaded at the locations of the gate-drive cells via phototechnology.

Because the start-up cells supply a permanent charging current even when a high drain-source voltage of the active cell array is present, they must be both short-circuit-proof and thermostable. In order to obtain the short-circuit strength, partial shading of the channel terminal implantation should advantageously be performed. A procedure of this type is described for example in commonly owned German Patent DE 198 08 348 C1, corresponding to U.S. Pat. No. 6,271,562.

In a further advantageous refinement, the source regions are laterally insulated from the start-up cells in order to form "surge detection cells". The surge detection cells are configured in such a way that the breakdown voltage of these cells lies below the value of the breakdown voltage of the MOS cells of the active cell array. The source regions of the surge detection cells can therefore reach into the substrate to a lesser extent than the wells of the second conductivity type of the MOS cells of the active cell array. These regions are advantageously provided for contact-connection with a resistor. Overvoltage detection is achieved in a simple manner as a result. As an alternative or in addition, the doping of the surge detection cell can be chosen in such a way that its breakdown voltage has a lower value than the breakdown voltage of the MOS cells of the active cell array, e.g. by increasing the doping of the p-type region 13' below the p-type well. As soon as the drain-source voltage of the semiconductor component exceeds the breakdown voltage of the surge detection cell, a current that raises the potential of the cell flows in the cell. This voltage rise can then be detected (i.e. with a resistor) and used as a trigger of suitable protective measures, for example, with a control IC. It would also be conceivable for the gate of the MOS cells of the active cell arrays to be driven directly, and protected, with a suitable metallization. The variation of the breakdown voltage can be achieved most simply by the source regions of the surge detection cell reaching into the substrate to a lesser extent than the wells of the second conductivity type of the MOS cells of the active cell array. The fabrication process known from the compensation elements can then advantageously be used or varied.

Consequently, the advantage of the surge detection cell is that active zener protection that is completely independent of external circuit measures can be realized in a simple manner. The potential rise of the surge detection cell can be used directly for switching on the first gate of the MOS cells of the active cell array via a plurality of start-up cells. As a result, the drain-source voltage of the semiconductor component and, correspondingly, the potential of the surge detection cell decrease. Consequently, a stable situation is established in which a first gate voltage different from zero volts (0 V) is present and wherein a drain-source voltage above the breakdown voltage of the surge detection cell but below the breakdown voltage of the main transistor is established. The semiconductor component is thus protected and cannot attain avalanche.

When wiring with an external resistor, the first gate is switched on only when the breakdown voltage of the surge detection cell is exceeded. However, if the threshold voltage is exceeded in the region of the punch-through voltage of the surge detection/start-up cell array, the first gate of the semiconductor component remains switched off. In order to protect the surge detection cell, the external resistor must be dimensioned in such a way that, in the case of a maximum current-carrying capacity of the surge detection cell, the drain potential exceeds the breakdown voltage of the main transistor. Seen figuratively, the approximately rectangular breakdown characteristic curve of the active cell array is consequently initially intersected with a resistance straight line. In an advantageous manner, the surge detection cell is laterally insulated in such a way that the voltage rise of the source region of the surge detection cell leads neither to the switching-on of the body diode with respect to the substrate nor to breakdown with respect to adjacent cells that are at the source potential. Suitable edge structures are described for example in German Published, Non-prosecuted Patent Application DE 197 48 524 A1.

The dimensioning of the self-switching-on structure, including start-up cells and parasitic gate-drive cells, can advantageously be facilitated by cascading a plurality of stages of gate-drive cells and start-up cells, respectively.

Thus, a plurality of gate-drive cells can switch on, for example, ten start-up cells. Therefore, the charging current thereof is used to switch on a further thousand (1,000) start-up cells. The current of these cells can then be utilized for rapidly switching on a large-area active cell array.

If the drain-source voltage falls below the value of the externally buffered source potential of the start-up cells, the charging current of the start-up cells is extinguished. This makes it possible to realize, for example, voltage zero-point identification or a status signal.

For renewed switching-on of the start-up cells, it is then necessary to renew the buried charge in the source region of the gate-drive cell. Because the potential of the source regions of the gate-drive cell floats, this cannot be done by diffusion of holes from the source region itself, since no current can subsequently be supplied externally. However, the required charge can be provided by injection of holes from the source region of the start-up cells. For this purpose, the source region in the start-up cells must be connected to a small capacitor, so that the potential of the well of the second conductivity type of the start-up cells is held at a positive voltage. As soon as the drain-source voltage of the start-up cell falls below this potential, the body diode injects holes. Consequently, an existing space charge zone below the gate-drive cell is reduced very rapidly since the depleted source regions are reverse-biased with respect to the substrate and thus represent the most negative potential for the injected holes in the vicinity. The source region of the gate-drive cell is thus flooded with holes and is thus again available for a repeated switch-on cycle.

The semiconductor component according to the invention can be used both for n-channel transistors and for p-channel transistors. If the semiconductor component is embodied as an IGBT, a reset structure is not required since the holes can be injected via a rear-side emitter. In the event of a large injection of charge carriers, however, the potential of the gate-drive cell can rise far in excess of the potential of the start-up cell, whereby there is the risk of destruction of the gate oxide. This can be reduced by limiting the voltage between the start-up cell and the source region of the gate-drive cell.

Other features which are considered as characteristic for the invention are set forth in the appended claims.

Although the invention is illustrated and described herein as embodied in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a cross-sectional view through part of a vertical semiconductor component;

FIG. 7 is a cross-sectional view through a lateral semiconductor component according to the invention.

DESCRIPTION OF THE PREFERRED EMBODIMENTS

Figure 1:
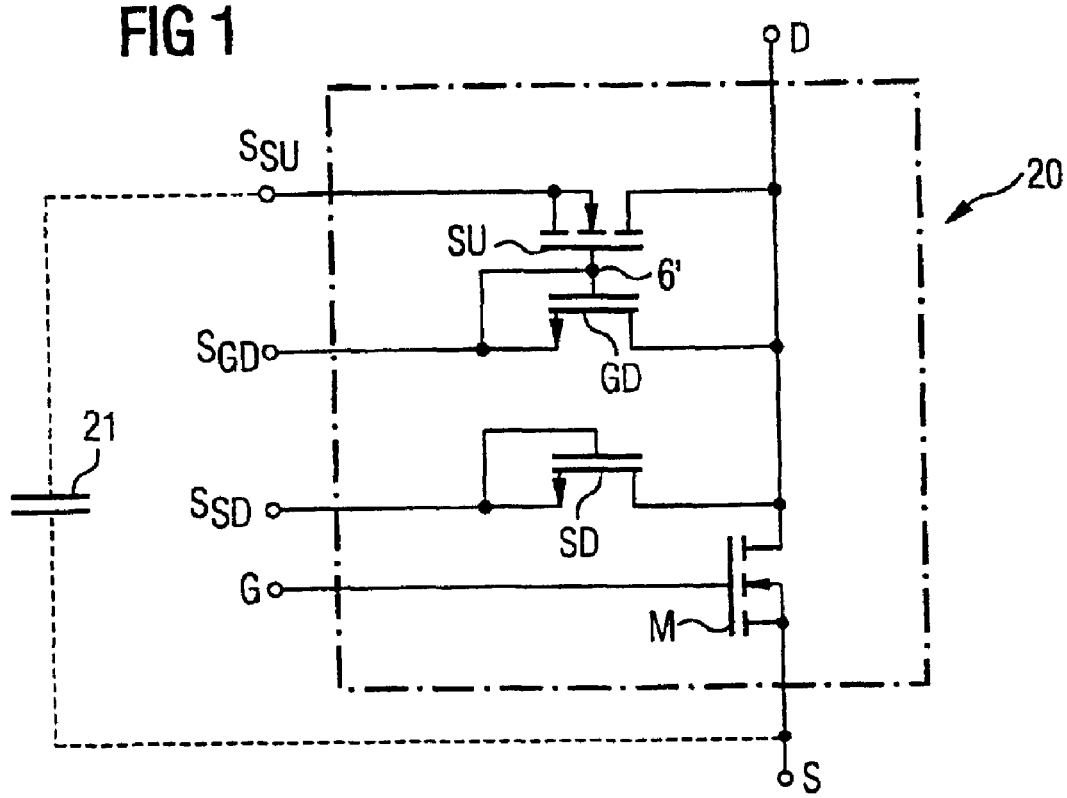
FIG. 1 is a simplified, schematic diagram of a semiconductor component according to the invention.

Referring now to the figures of the drawings in detail and first, particularly to FIG. 1 thereof, there is shown a simple electrical equivalent circuit diagram of a semiconductor component 20 according to the invention. The semiconductor component 20 has an n-channel MOSFET M formed from a multiplicity of MOS cells that are connected in parallel and represent the active cell array of the semiconductor component 20. A drain terminal D and a source terminal S form the two load terminals of the semiconductor component 20. A high voltage, which might be in the region of several hundred volts, for example, is present at the load terminals D, S. Moreover, a further n-channel MOSFET SU is provided, which is connected by its drain terminal to the drain terminal D of the MOSFET M. A parasitic transistor GD is connected by its drain terminal likewise to the drain terminal D of the MOSFET M. Its gate terminal is connected firstly to the gate terminal of the MOSFET SU and secondly to the source terminal $S_{GD}$ of the transistor GD. The potential of the source terminal $S_{GD}$ floats relative to the source potential of the MOSFETs M and SU.

In practice, a capacitor 21 will be connected between the source contact S of the MOSFET M and the source contact $S_{SU}$ of the MOSFET SU, as is indicated by broken lines in FIG. 1. By virtue of the capacitive coupling of the two source terminals, when a specific threshold voltage is exceeded between the drain terminal D and the source terminal S, the parasitic transistor GD is able to turn on the MOSFET SU, which could then drive for example a control IC (see FIGS. 4–5) with a low voltage potential in comparison with the load terminals, which, for its part, could be connected to the gate G of the MOSFET for driving purposes. The magnitude of the threshold voltage at which the semiconductor switch SU is turned on can be fixed by technological measures (implantation dose, gate oxide thickness).

FIG. 2 shows a cross section through the vertical semiconductor component according to the invention. The semiconductor component 20 has a substrate 1 having a first side I and a second side II, which substrate is n-conducting in the present example. A highly doped region of the same conductivity type is disposed on the second side II, which region constitutes the drain region 2. A metallization layer is applied on the drain region 2, on the side remote from the substrate 1, which metallization layer constitutes a drain contact 3.

A multiplicity of MOS cells M is provided on the first side I of the substrate 1, only two MOS cells M being illustrated in a manner representative of the multiplicity. In this case, a MOS cell M has a first well 4 of a conduction type, p in the present case, opposite to the substrate, which first well 4 is introduced into the substrate 1 and reaches to the first side I. A first source region 5, which is n-conducting, is introduced in the p-type well 4. This source region 5 reaches to the first side I of the substrate 1.

An insulating layer 8 is applied on the first side I of the substrate 1. This insulating layer 8 is perforated at the locations of the first source regions 5 of the MOS cells M, so that the first source region 5 is electrically conductively connected to a first source contact 6. A first gate 7 is applied on the insulating layer 8, which first gate 7 partly covers the p-type well 4 and is likewise connected via a metallic gate contact (not shown).

Further MOS cells SU are provided in the substrate 1, in a manner isolated from the MOS cells M by a lateral insulation 8. The further MOS cells, so-called start-up cells SU, are in this case constructed in exactly the same way as the MOS cells M. This means that a p-type well 4' is incorporated into the substrate 1, into which well, for its part, a source region 5' is incorporated, which reaches to the first side I. The source region 5' is electrically connected to a second source contact 6' reaching through the insulating layer 8. The first and the second source contact 6, 6' are not electrically connected to one another. The same applies to the corresponding gate contacts (not shown).

A second gate 7' is situated on the insulating layer 8 and at least partly covers the p-type well 4'. Furthermore, the gate 7' partly covers a source region 11 which, together with the p-type well 4' and the substrate 1, forms a parasitic pnp transistor. The latter is referred to as a "gate-drive cell" GD. The gate-drive cells GD are electrically connected to the gate 7'. The electrical connection to the gate 7' can be made, for example, via a metallic contact-connection 10.

In order to ensure that the start-up cells SU are turned on when a threshold voltage is exceeded between the drain contact 3 and the first source contact 6 of the semiconductor component, the p-type region 11 is configured in such a way that the charge situated therein suffices to bring the second gate 7' to a sufficiently high potential. Therefore, provided below the p-type region 11 lies a further region 11' of the same conductivity type, which is electrically readily conductively connected to the p-type region 11.

Figure 3:
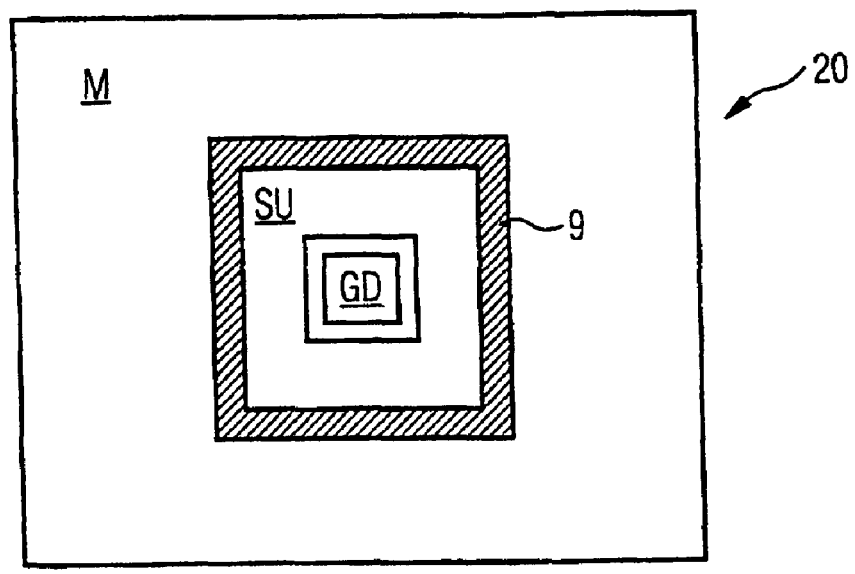
FIG. 3 is a plan view of the vertical semiconductor component according to the invention.

FIG. 3 illustrates the preferred configuration of the p-type regions 11, 11', that is to say the p-type region 11' extends orthogonally from the first side I to the second side II of the semiconductor component. In order to increase the current-carrying capacity before or during breakdown and also to achieve a high avalanche strength of the MOS cells M, a p-type region 12 formed orthogonally to the first side I is likewise provided below the p-type wells 4. The same likewise applies to the start-up cells SU, in which there is a buried p-type region 12' below the second p-type well 4'.

In FIG. 3, the buried p-type region 11 is surrounded by (in cross section) two start-up cells SU. It would also be conceivable for a start-up cell SU to be surrounded by buried p-type regions 11.

Furthermore, FIG. 3 illustrates a "surge detection cell" SD, which, in principle, is constructed in a similar manner to a gate-drive cell GD. The surge detection cell SD also has a buried p-type region 13 below its p-type region SD, but the p-type region 13, compared with the p-type regions 12 of the MOS cells M, is formed to a lesser extent in the direction of the second side. As a result, the surge detection cell SD has a reduced breakdown voltage compared with the MOS cell M. It can then be used as overvoltage detection in the case of wiring with an external resistor. Furthermore, in the case of suitable wiring with the start-up cells, active zener protection of the semiconductor component is possible. Furthermore, the surge detection cell SD is laterally insulated from the start-up cells SU.

If the highly doped n$^+$-type layer 2 is replaced by a p-type layer, then the semiconductor component is embodied as an IGBT, whereas a MOSFET forms the basic structure in the present drawing.

FIG. 3 shows one possible configuration of the different cell types of the semiconductor component according to the invention in a plan view. In the present case, the gate-drive cells GD are surrounded exclusively by start-up cells SU. However, it would also be conceivable for a plurality of start-up cells to be surrounded exclusively by gate-drive cells. This configuration is, for its part, in turn surrounded by a lateral insulation, which is in turn surrounded by MOS cells M. The layout of the individual cells can be effected in a known manner in this case. A strip layout is possible; the cells can have a circular cross section and occupy a hexagonal area packing or, in the case of a circular cross section, occupy an approximately square area packing or have a strip-shaped cross section. The same applies to the configuration of the start-up cells and the gate-drive cells.

Figure 4:
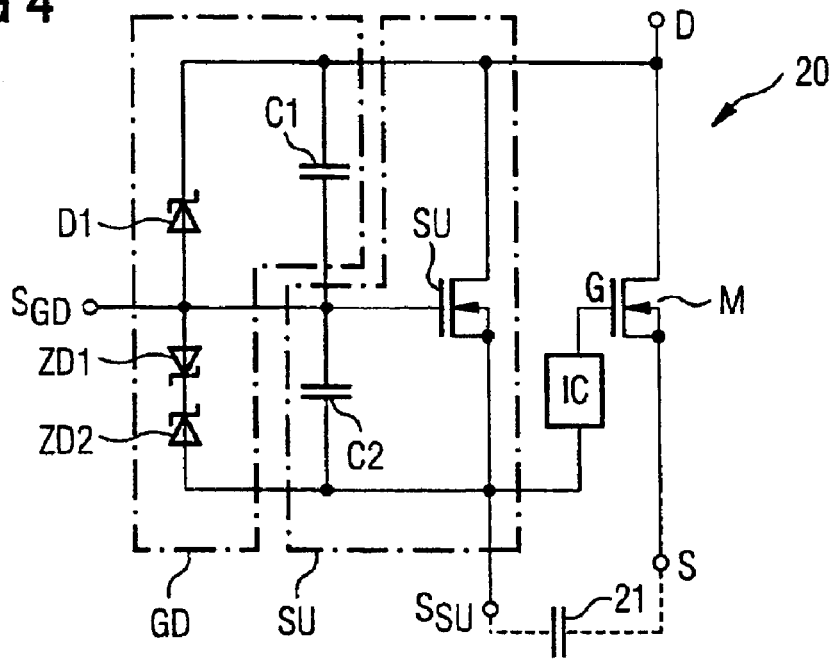
FIG. 4 is a schematic diagram of a further embodiment of the semiconductor component showing the physical method of operation.

FIG. 4 shows an electrical equivalent circuit diagram for the semiconductor component according to the invention that is known from FIG. 3. FIG. 4 reveals the physical method of operation particularly well. The semiconductor component 20 according to the invention has a MOSFET M including a multiplicity of MOS cells that are connected in parallel and form the active cell array. On the drain side, the MOSFET M is connected to the drain terminal of a further MOSFET SU. On the source side, the MOSFET SU is connected via an integrated circuit IC to the gate G of the MOSFET M. It would also be conceivable for the source terminal of the MOSFET SU to be directly connected to the gate of the MOSFET M. Capacitance C2 represents the gate-source capacitance of the MOSFET SU. A further capacitance C1 is connected up between the gate and the drain terminal of the MOSFET SU. This capacitance represents the charge present in the buried p-type region 11, 11' (space charge zone capacitance). Furthermore, a diode D1 is connected in parallel with the capacitance C1, the anode terminal of the diode being connected to the gate of the MOSFET SU, while the cathode terminal is connected to the drain terminal D. Two zener diodes ZD1, ZD2 are reverse-connected in series between the gate and the source of the MOSFET SU. This means that the anode terminal of the zener diode ZD1 is connected to the gate of the MOSFET SU, the cathode terminals of the zener diodes ZD1, ZD2 are connected to one another, while the anode terminal of the zener diode ZD2 is connected to the source $S_{SU}$ of the MOSFET SU. The capacitance C1, the diode D1, and the two zener diodes ZD1, ZD2 form the gate-drive cell GD. Furthermore, the gate of the MOSFET SU represents the "source terminal $S_{GD}$" of the gate-drive cell GD. Moreover, an external charge store 21 connected up between the source terminals, the MOSFETs SU, M, is represented by broken lines in FIG. 4.

The diode D1 represents the junction between the buried p-type region 11, 11' and the substrate 1. The zener diodes ZD1, ZD2 reverse-connected in series form the parasitic transistor between the buried p-type region 11, the substrate 1 and the p-type well 4' of the start-up cell SU. The spacing between the start-up cell and the buried p-type region 11, 11' is such that the two zener diodes ZD1, ZD2 ideally have a reverse voltage of approximately 8 volts. The dimensioning of ZD1, ZD2 should ideally be identical. The threshold voltage of the MOSFET SU should be approximately 4 to 5 volts. The turning-on of the MOSFET M by application of a high voltage between the drain and source terminals can be explained as follows: the gate-drive cell GD serves as control electrode for the MOSFET SU. This means that no current flows in the gate-drive GD itself; a current for charging the gate of the MOSFET SU is provided only on application of a high voltage between the drain and source terminals. The capacitance C1 forms a voltage divider together with the zener diodes ZD1, ZD2 reverse-connected in series. On application of the high voltage between the drain terminal D and the source terminal S, the potential at the center tap of the voltage divider begins to rise. The charge that is stored in the capacitance C1 and is provided from the buried region 11, 11' begins to charge the gate-source capacitance C2 of the MOSFET SU. This causes the MOSFET SU to turn on; a current can flow to the source terminal $S_{SU}$ of the MOSFET SU. Due to the external capacitance 21, the potential at the source terminal $S_{SU}$ begins to rise. The zener diode ZD2 then performs a voltage-limiting function, i.e. the voltage between the gate terminal and the source terminal of the MOSFET SU is held at a value of approximately 8 volts. This value can be set by the dimensioning of the zener diodes ZD1, ZD2. Due to this permanent potential difference, the MOSFET SU remains in the on state.

The capacitance 21 is dimensioned in such a way that the voltage value present at the source terminal $S_{SU}$ reaches a magnitude that can drive the integrated circuit IC. The latter can then drive the gate of the MOSFET M, and turn the latter on, in a suitable manner.

The MOSFET M is switched off only when the MOSFET SU is in an off state. For this purpose, on one hand, it is conceivable for the source terminal $S_{SU}$ to be short-circuited with the source terminal S of the MOSFET M. On the other hand, it would also be conceivable for the source terminal $S_{SU}$ to be connected to the source terminal $S_{GD}$, SO that the capacitance C2 could be discharged.

The diode D1 simultaneously represents a surge detection cell SD. Active zener protection of the MOSFET M is possible by suitable dimensioning, which is determined either by the doping or, alternatively, the depth of the buried region 13'. The breakdown voltage of the diode D1, which then acts as a zener diode, must be set in such a way that it is smaller than the breakdown voltage of the MOSFET M. If the breakdown voltage of the diode D1 is exceeded, then it supplies a charging current for the gate of the MOSFET $S_{SU}$, which is turned on in the manner described, and in this way turns the MOSFET M on. Destruction of the MOSFET M can thereby be prevented.

As already mentioned in the introductory part, it is also conceivable, given suitable dimensioning of all the components shown, for the gate of the MOSFET M to be directly connected to the source terminal of the MOSFET SU.

Figure 5:
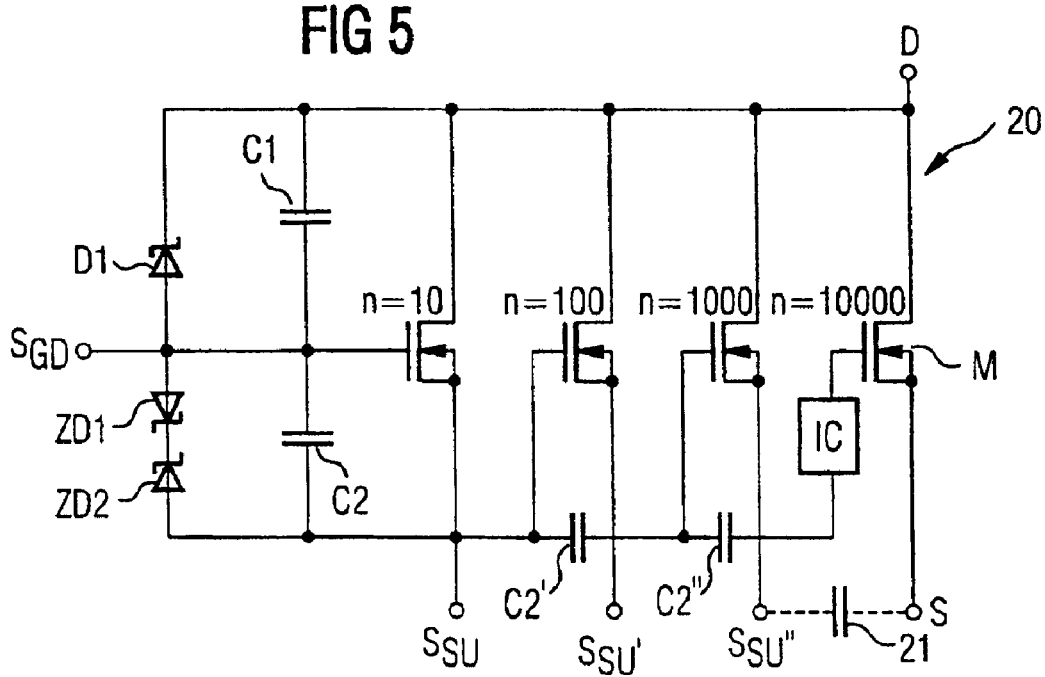
FIG. 5 is a schematic diagram of a further embodiment of the semiconductor component showing the principle of cascading.

FIG. 5 shows an extension of the equivalent circuit diagram from FIG. 4. FIG. 5 illustrates cascading of the start-up cells. If, by way of example, the gates of ten start-up cells SU are charged by the capacitance C1, then the current generated at the source terminal $S_{SU}$ can be used to drive the gate of in each case a further ten start-up cells $S_{SU'}$. In total, then, 100 start-up cells $S_{SU'}$ are in the on state, which can in turn each turn on ten further start-up cells $S_{SU''}$. 1000 start-up cells $S_{SU''}$ are then available which can charge the external capacitance 21. This simple cascading makes it possible also to drive a large active cell array (MOSFET M). In the example described, it was assumed that a start-up cell SU was able to turn on ten further cells. In accordance with the number of cascading stages, any desired charge can be generated which suffices to turn on a MOSFET M.

Figure 6:
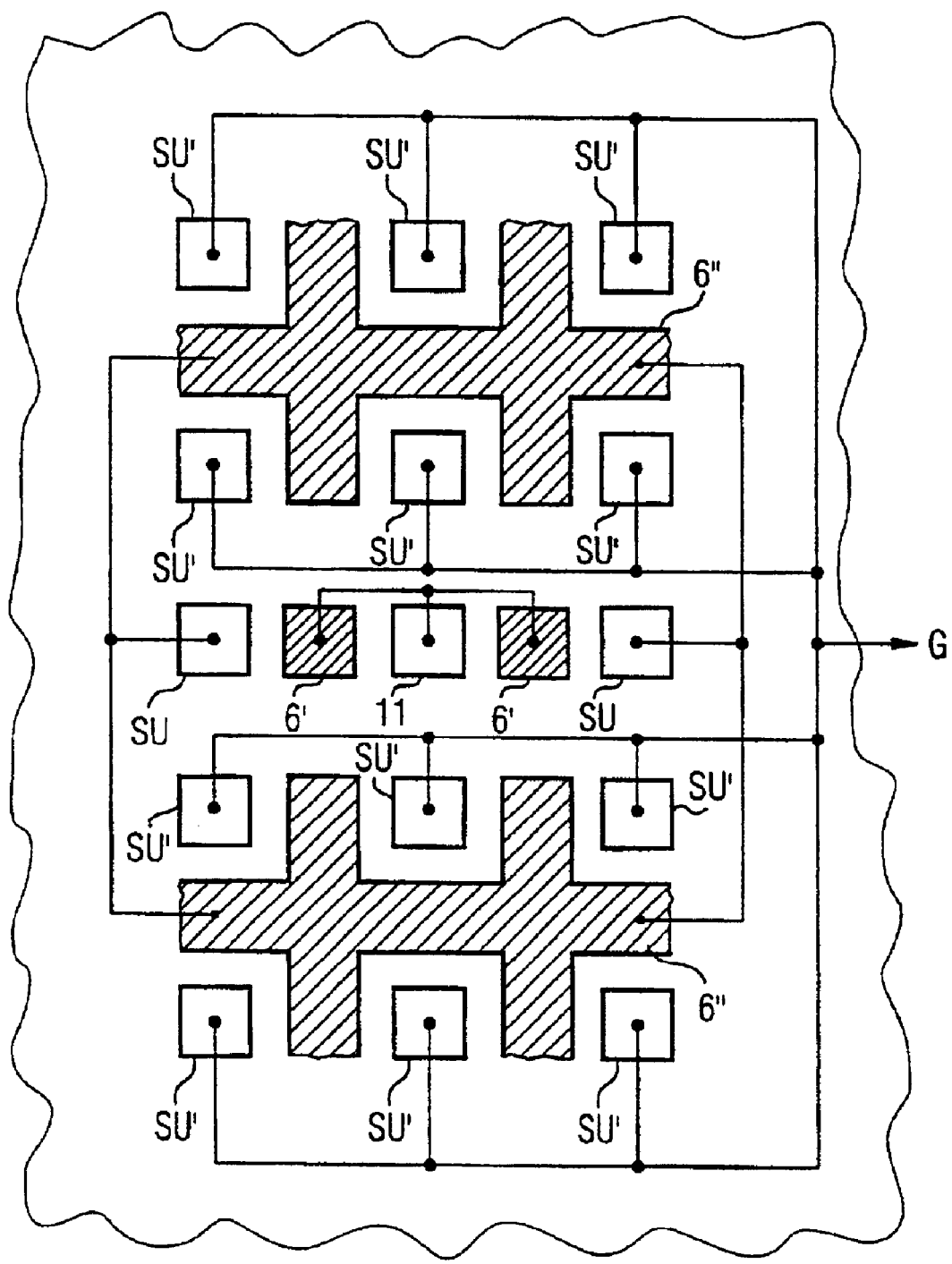
FIG. 6 is a plan view showing a basic cell configuration and the electrical wiring thereof for cascading.

FIG. 6 illustrates a plan view of a cell array cascaded in this way. A buried p-type region 11 is electrically connected to two adjacent gates 6'. The gates 6' turn on the adjacent start-up cells SU that, on the source side, are electrically connected to further gates 6''. The gates 6'' can be used to turn on a further twelve start-up cells SU', which can then be connected, for example, directly to the gate of the MOSFET M.

In the case of cascading the start-up cells care must be taken to ensure that the gate metallization layer of each cascade can be contact-connected externally. In order to switch the MOSFET M off, each individual cascading stage must be switched off, so that a charge "remains" in none of the start-up cells.

In FIG. 7, the cells illustrated have a square layout. It is also conceivable, of course, for the cells to be of circular or hexagonal construction.

FIG. 7 shows a cross section through a laterally constructed semiconductor component. On the left-hand side, FIG. 7 shows the MOS cells M constructed in a known manner. In the same way as in the case of the vertically constructed semiconductor component, the start-up cells S1 are provided with a dedicated, second source contact. This second source contact 6' is electrically insulated from the first source contact 6 of the MOS cells M. The mutual insulation of the cells is realized by a lateral insulation 9. The gate-drive cell GD is embodied as a parasitic transistor between the buried p-type region 11, the substrate 1 and the p-type well 4', the charge required for charging the second gate 7' being present in the buried p-type regions 11, 11'. The buried p-type region 11' extends from the p-type region 11 in the direction of the drain 3 along the first side I of the substrate 1. The buried p-type region 11' is in good electrical contact with the p-type region 11. Furthermore, it now goes without saying that the p-type region 11 is electrically connected to the second gate 7'.

The present semiconductor component makes it possible to generate a signal from a high load voltage at the load terminals of a MOSFET or IGBT, which signal is suitable for driving a control IC or directly the control electrode of the semiconductor component.

We claim:

1. A vertical semiconductor component, comprising:
   a substrate of a first conductivity type having a first and a second side;
   an insulating layer covering said first side and having a side remote from said substrate;
   a more highly doped layer of the first conductivity type applied on said second side;
   a metallic drain contact applied on said more highly doped layer;
   a metallic gate contact;
   a multiplicity of MOS cells on said first side of said substrate for forming a first semiconductor switch, each MOS cell having:
   a first well of the second conductivity type, said first well being introduced into said substrate and reaching said first side;
   a first metallic source contact extended through said insulating layer;
   a first source region of the first conductivity type being incorporated into said well and having a potential, reaching to said first side of said substrate, and connecting to said first metallic source contact;
   a first gate on said side of said insulating layer remote from said substrate, said first gate partly covering said well and connecting to said metallic gate contact;
   a plurality of further MOS cells identical to said multiplicity of MOS cells, said further MOS cells having a second well, a second source region having a potential, a second gate on said first side of said substrate for forming a second semiconductor switch; and a second source contact electrically insulated from said first source contact and extending through said insulating layer; said second source regions of said further MOS cells connected to said second source contact on said first side; and a region of the second conductivity type being incorporated into said substrate, reaching to said first side, and electrically connecting to said second gate of said further MOS cells, said region having a potential floating relative to the potential of the first and second source regions of said MOS cells and further MOS cells.

2. The vertical semiconductor component according to claim 1, wherein said region of the second conductivity type is surrounded exclusively by said further MOS cells, to form a structure for switching on said MOS cells.

3. The vertical semiconductor component according to claim 2, wherein said switching-on structure is disposed adjacent said MOS cells of said first semiconductor switch.

4. The vertical semiconductor component according to claim 2, wherein said switching-on structure is surrounded by said MOS cells.

5. The vertical semiconductor component according to claim 2, including a lateral insulation provided between said MOS cells and said structure switching on said MOS cells.

6. The vertical semiconductor component according to claim 1, wherein at least one of said further MOS cells is surrounded exclusively by regions of the second conductivity type, to form a structure for switching on said MOS cells.

7. The vertical semiconductor component according to claim 6, wherein said switching-on structure is disposed adjacent said MOS cells of said first semiconductor switch.

8. The vertical semiconductor component according to claim 6, wherein said switching-on structure is surrounded by said MOS cells.

9. The vertical semiconductor component according to claim 6, including a lateral insulation provided between MOS cells and said structure switching on said MOS cells.

10. The vertical semiconductor component according to claim 1, wherein:

said region is formed in the direction of said second side and holds a charge; and a space charge zone is defined between said further MOS cells and said region, said space charge zone propagating the charge and driving said gate of the further MOS cells therewith.

11. The vertical semiconductor component according to claim 10, wherein said region extends orthogonally from said first side toward said second side.

12. The vertical semiconductor component according to claim 1, wherein said wells of said MOS cells and further MOS cells extend orthogonally from said first side to said second side.

13. The vertical semiconductor component according to claim 1, including a plurality of said regions, some of said regions being laterally insulated from said further MOS cells and reaching into said substrate less than said wells of said MOS cells.

14. The vertical semiconductor component according to claim 1, including a plurality of said regions, some of said regions being laterally insulated from said further MOS cells and doped to create a breakdown voltage less than a breakdown voltage of said MOS cells.

15. The vertical semiconductor component according to claim 1, wherein the first conductivity type is n-conducting.

16. The vertical semiconductor component according to claim 1, wherein said further MOS cells are connected in a cascaded manner.

17. The vertical semiconductor component according to claim 1, wherein said regions are connected in a cascaded manner.

18. The vertical semiconductor component according to claim 17, wherein said further MOS cells are also connected in a cascaded manner.

* * * * *